US012354773B2

(12) United States Patent
Luzzi et al.

(10) Patent No.: US 12,354,773 B2
(45) Date of Patent: Jul. 8, 2025

(54) DEVICES AND METHODS FOR CONNECTING TO A METALLIC SHIELD OF A CABLE

(71) Applicant: Richards Mfg. Co., Irvington, NJ (US)

(72) Inventors: Glenn J. Luzzi, Mt. Bethel, PA (US);
Jeff Madden, Bernardsville, PA (US);
Christopher A. Juillet, Hoboken, NJ (US)

(73) Assignee: RICHARDS MFG. CO. SALES, LLC, Irvington, NJ (US)

( * ) Notice: Subject to any disclaimer, the term of this patent is extended or adjusted under 35 U.S.C. 154(b) by 450 days.

(21) Appl. No.: 17/649,222

(22) Filed: Jan. 28, 2022

(65) Prior Publication Data

US 2022/0157492 A1 May 19, 2022

Related U.S. Application Data

(62) Division of application No. 15/992,700, filed on May 30, 2018, now Pat. No. 11,276,513.

(51) Int. Cl.
| | |
|---|---|
| *H01B 9/02* | (2006.01) |
| *H01B 13/00* | (2006.01) |
| *H01B 13/26* | (2006.01) |
| *H01R 4/06* | (2006.01) |
| *H01R 4/48* | (2006.01) |
| *H02G 1/14* | (2006.01) |
| *H02G 15/06* | (2006.01) |
| *H05K 9/00* | (2006.01) |

(52) U.S. Cl.
CPC .......... *H01B 9/024* (2013.01); *H01B 13/0036* (2013.01); *H01B 13/26* (2013.01); *H01R 4/06* (2013.01); *H01R 4/48* (2013.01); *H02G 1/14* (2013.01); *H02G 15/06* (2013.01); *H05K 9/0098* (2013.01)

(58) Field of Classification Search
CPC .......... H02G 1/14; H02G 15/06; H02G 15/08; H02G 15/085; H02G 15/105; H02G 15/188; H01R 4/06; H01R 4/48; H01R 4/4809; H01R 4/4863; H01R 4/646; H01R 9/0524; H01R 9/0527; H01R 13/6592; H01R 43/005; H01R 43/033; Y10T 29/49194; Y10T 29/49195; Y10T 29/49201; Y10T 29/53239
See application file for complete search history.

(56) References Cited

U.S. PATENT DOCUMENTS

| | | | |
|---|---|---|---|
| 2,798,113 A | | 7/1957 | Koller |
| 3,324,423 A | * | 6/1967 | Webb ........................ H01P 1/16 343/786 |
| 3,376,540 A | | 4/1968 | Turban |
| 3,593,002 A | | 7/1971 | Hebert |

(Continued)

FOREIGN PATENT DOCUMENTS

GB 2232020 A * 11/1990 .......... H01R 4/2404

*Primary Examiner* — Jeffrey T Carley
(74) *Attorney, Agent, or Firm* — Nixon Peabody LLP

(57) ABSTRACT

The present disclosure describes various devices and methods for the reconstruction or restoration of a metallic shield of a cable, which provide a holding feature for simplifying the installation of an electrically-conductive member on the metallic shield and improving the reliability of the connection. Both factory-supplied and field-installable holding features are described.

13 Claims, 14 Drawing Sheets

(56) References Cited

U.S. PATENT DOCUMENTS

| | | | |
|---|---|---|---|
| 3,673,311 A | | 6/1972 | Misare |
| 3,887,895 A | * | 6/1975 | Pierzchala ............. H01R 4/646 |
| | | | 439/98 |
| 4,032,205 A | | 6/1977 | Taj |
| 4,080,024 A | | 3/1978 | Kroon |
| 4,164,621 A | * | 8/1979 | Silva ................... H02G 15/105 |
| | | | 156/49 |
| 4,289,553 A | | 9/1981 | Nolf |
| 4,414,969 A | | 11/1983 | Heyman |
| 4,565,417 A | | 1/1986 | Dussel |
| 4,646,393 A | * | 3/1987 | Young ................... B65D 63/08 |
| | | | 24/23 W |
| 4,790,765 A | * | 12/1988 | Ehrenfels ............... H01R 13/33 |
| | | | 439/98 |
| 4,896,402 A | * | 1/1990 | Jansen ................. F16L 33/023 |
| | | | 24/20 R |
| 5,027,864 A | | 7/1991 | Conti |
| 5,028,742 A | * | 7/1991 | Redman ............... H02G 15/068 |
| | | | 439/98 |
| 6,316,723 B1 | * | 11/2001 | Woehl ............. H01R 13/65912 |
| | | | 174/40 CC |
| 6,777,616 B2 | | 8/2004 | Beele |
| 9,558,866 B2 | | 1/2017 | Shiga |
| 9,923,285 B2 | | 3/2018 | Julliet |
| 2018/0090855 A1 | * | 3/2018 | Simonsohn ........ H01R 13/6592 |

\* cited by examiner

DEVICES AND METHODS FOR CONNECTING TO A METALLIC SHIELD OF A CABLE

STATEMENT REGARDING PRIOR DISCLOSURES BY THE INVENTOR OR A JOINT INVENTOR UNDER 37 C.F.R. 1.77(b)(6)

CROSS-REFERENCE TO RELATED APPLICATIONS

This application is a divisional of U.S. application Ser. No. 15/992,700, filed on May 30, 2018, which is hereby incorporated by reference herein in its entirety.

A prior device, method, and clamping assembly for connecting to a metallic shield of a cable was disclosed in U.S. application Ser. No. 15/187,019, filed Jun. 20, 2016, which was published as U.S. Publication No. US 2017/0365937 on Dec. 21, 2017, and issued as U.S. Pat. No. 9,923,285 on Mar. 20, 2018, the contents of which are incorporated by reference herein in their entirety. Glenn J. Luzzi, Jeff Madden, and Christopher A. Juillet, the inventors of the subject matter disclosed and claimed in the present application, also invented the subject matter disclosed and claimed in U.S. Pat. No. 9,923,285.

BACKGROUND

Power cables typically used in utility systems from 4 kV to 35 kV comprise several elements including a conductor that carries the electrical power, insulation around the conductor, a semiconductive layer around the insulation, a metallic shield around the semiconductive layer and finally an overall environmental jacket. Whenever such power cables are spliced or terminated, each of the cable elements must be properly reconstructed at the splice or terminating device. In particular, devices are used to reconstruct or restore the cable metallic shield. Such devices are required to ensure that any steady-state and short-circuit currents can be adequately carried from one cable to the second cable, or from a cable to an earth ground connection, as required. In addition, these devices must perform adequately for the life of the cable on which they are installed, which is typically considered to be about 40 years.

SUMMARY

The present invention generally relates to cable shielding and provides, in various embodiments, methods and devices for electrically connecting to the metallic shield of a cable.

In some embodiments, the invention provides a device for connecting to a metallic shield of a cable, comprising an electrically-conductive member comprising a metal braid, and a holding feature comprising a constant force spring.

In some embodiments, the invention further comprises an unwinding feature configured for grasping and pulling to install the constant force spring.

In some embodiments, the unwinding feature comprises a loop.

In some embodiments, the unwinding feature is disposed through an axial opening of the constant force spring.

In some embodiments, the unwinding feature is fixed to the constant force spring.

In some embodiments, the conductive member comprises copper.

In some embodiments, the conductive member is tin plated.

In some embodiments, the conductive member is fixed to the constant force spring by a fastening feature.

In some embodiments, the fastening feature comprises a rivet.

In some embodiments, the conductive member is fixed to the constant force spring without a fastening feature.

In some embodiments, the constant force spring includes a slit, and the conductive member is threaded through the slit and bent to secure thereto.

In some embodiments, the conductive member is fixed to the constant force spring via a sheet.

In some embodiments, the sheet is fixed to the constant force spring by a first fastening feature, and the conductive member is fixed to the sheet by a second fastening feature, wherein at least one of the first fastening feature and the second fastening feature comprise at least one rivet.

In some embodiments, the sheet is fixed to the constant force spring by a first fastening feature, and wherein the sheet includes at least one slit, and the conductive member is threaded through the at least one slit to secure thereto.

In some embodiments, the sheet is merged with the constant force spring.

In some embodiments, the conductive member and the constant force spring are provided as separate, unattached components, wherein the constant force spring includes a holding tab integral with the spring or fixed thereto by a fastening feature; or wherein the conductive member and the constant force spring include mating features configured to be connected in the field.

In some embodiments, the constant force spring includes a holding tab fixed thereto by a rivet.

In some embodiments, the conductive member and the constant force spring include mating features configured to be connected in the field, said mating features comprising a pin on the conductive member and a corresponding hole on the constant force spring.

In some embodiments, the invention provides a method of connecting to a metallic shield of a cable, comprising wrapping an electrically-conductive member comprising a metal braid at least partially around the metallic shield of the cable, thereby providing a direct mechanical and electrical connection thereto; and deploying a holding feature comprising a constant force spring around the wrapped conductive member to hold the conductive member against the metallic shield of the cable, wherein the constant force spring is provided with the conductive member factory-installed thereon, or the constant force spring is field-installable on the conductive member via a holding tab or mating features.

In some embodiments, said deploying comprises grasping and pulling an unwinding feature to unroll the constant force spring around the wrapped conductive member.

Additional features and advantages of the present invention are described further below. This summary section is meant merely to illustrate certain features of the invention, and is not meant to limit the scope of the invention in any way. The failure to discuss a specific feature or embodiment of the invention, or the inclusion of one or more features in this summary section, should not be construed to limit the invention as claimed.

BRIEF DESCRIPTION OF THE DRAWINGS

The foregoing summary, as well as the following detailed description of the preferred embodiments of the application, will be better understood when read in conjunction with the appended drawings. For the purposes of illustrating the systems and methods of the present application, there are shown in the drawings preferred embodiments. It should be understood, however, that the application is not limited to the precise arrangements and instrumentalities shown. In the drawings.

DETAILED DESCRIPTION

Figure 1A:
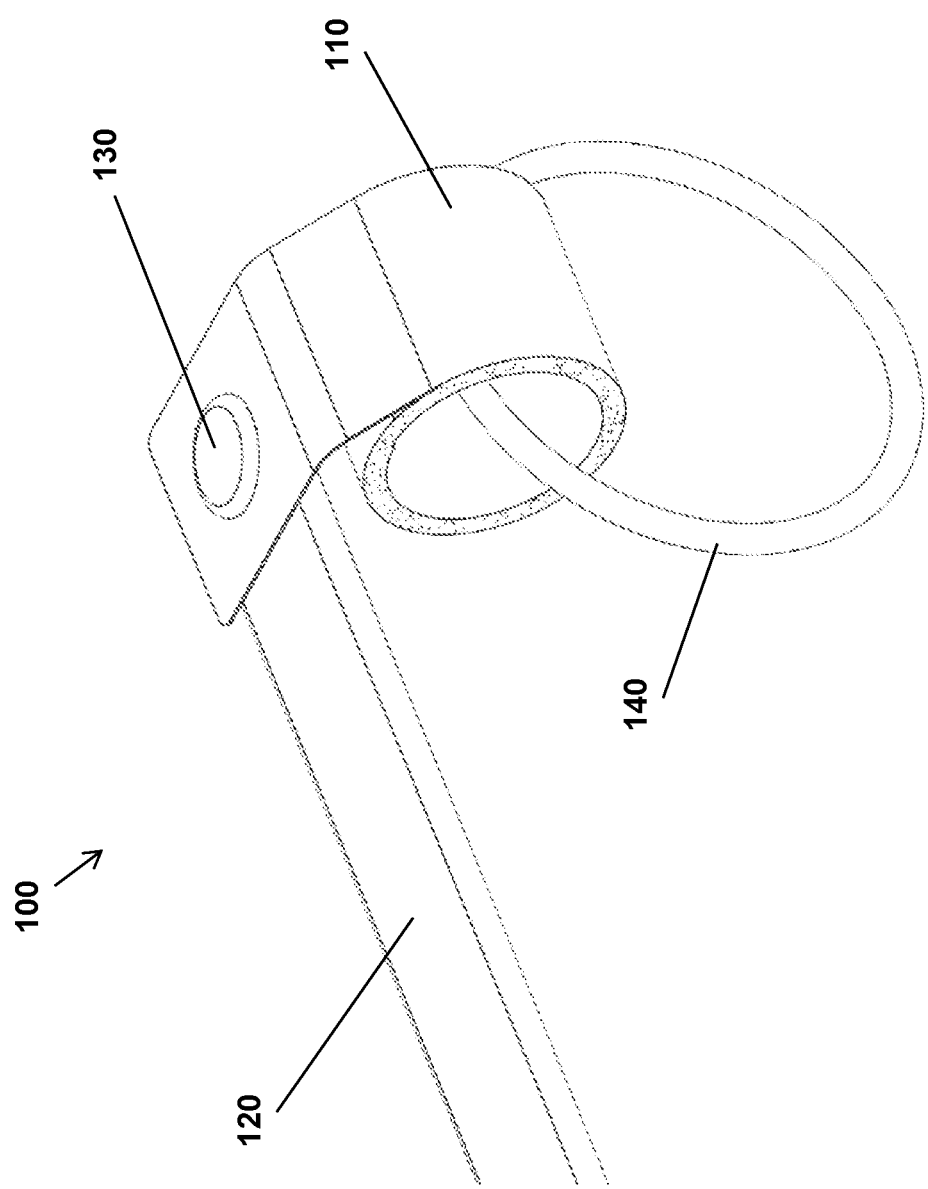
FIGS. 1A to 1C show a metallic shield connector of the present invention, according to a first exemplary embodiment.

Currently available devices used to reconstruct or restore the cable metallic shield suffer from a number of shortfalls, including: complex installation; difficulty in contacting the cable metallic shield uniformly around the circumference of the cable; inability to meet the design ratings of the cable; inability to meet the design ratings of the cable after the cable is operating at its designed steady-state current/temperature ratings for its full life; inconsistent field assembly; inconsistent contact resistance between the cable metallic shield and the device; changing contact resistance between the cable metallic shield and the device as the cable heats and cools; and difficulty in deploying constant force springs, including ergonomic concerns relating to personal injury.

Additionally, conventional methods of ensuring adequate contact resistance tend to deform the cable polymeric layers. Further, since cable metallic shields come in a variety of designs, including wire, tape, and longitudinally corrugated shield, as well as a variety of ampacity ratings, such as equal to the conductor, ⅓ of the conductor, 1/12 of the conductor etc., it is difficult to have a single device which is adequate for all designs.

The present invention addresses the above-identified problems and provides, in various embodiments, improved devices and methods for the reconstruction or restoration of the metallic shield of a cable, which provide a holding feature to facilitate installation. Devices of the present invention are configured to be installed on any shielded type cable to provide an electrical connection to the cable shield. This can be done at any point where the cable is spliced or terminated. The devices can be used for splicing two cables together or connecting a cable to some piece of equipment or separable connector.

The holding feature provided by devices of the present invention comprises a clamping device for biasing an electrically-conductive member against the metallic shield of a cable. The clamping device is preferably configured to hold the electrically-conductive member against the metal shielding of the cable with a relatively constant pressure while allowing for expansion and contraction of the metal shielding and underlying layers. In preferred embodiments, the clamping device is a constant force spring (typically steel). The clamping device may be factory installed or field installed, as described in further detail below.

In some embodiments, devices of the present invention include an unwinding feature to assist in unrolling the constant force spring (e.g., for ease of installation and improved user safety). The unwinding feature is configured for grasping and pulling to keep the installer's fingers at a distance away from the spring. The unwinding feature can be, for example, a loop. The unwinding feature is preferably plastic, but can be any material. In certain preferred embodiments, the unwinding feature is passed through the axial opening of the constant force spring and is loose. In other embodiments, the unwinding feature may be fixed to the spring by any suitable method (e.g., fastener, glue, welding, etc.).

In some embodiments, the electrically-conductive member comprises a metal braid. The braid is preferably copper, but can be any conductive material (e.g., a copper alloy such as bronze, aluminum or the like). In some embodiments, the braid may be tin plated for additional corrosion resistance. The conductive member can be any form of conductive metal, such as a round or square solid piece of material. The conductive member preferably has a high conductivity, such as 20% IACS (International Annealed Copper Standard) or higher, and allows conduction of steady state or momentary currents without exceeding 350° C. under typical current-carrying conditions.

In some embodiments, devices of the present invention may include a contact sheet between the clamping device and the electrically-conductive member. In certain preferred embodiments, the sheet is made of copper or another conductive material, and serves to mechanically and electrically connect to the braid. In other embodiments, the sheet can be plastic or another non-conductive material and only provides the mechanical connection to the cable neutrals (metallic shielding of the cable), with the braid itself electrically connecting to the cable neutrals. This configuration may not electrically contact all of the cable neutrals, which may be useful in situations with small cable neutrals.

In preferred embodiments, devices of the present invention are configured to prevent the spring from being installed directly onto the cable neutrals without the braid and/or contact sheet being underneath. With all separate pieces, the spring can be installed one to three turns (to mechanically hold it onto the cable) and then the braid installed, and then the spring install completed. This results in a very poor connection because the spring is a high resistance barrier between the cable neutrals and the braid. This is a common issue in the industry.

Figure 1B:
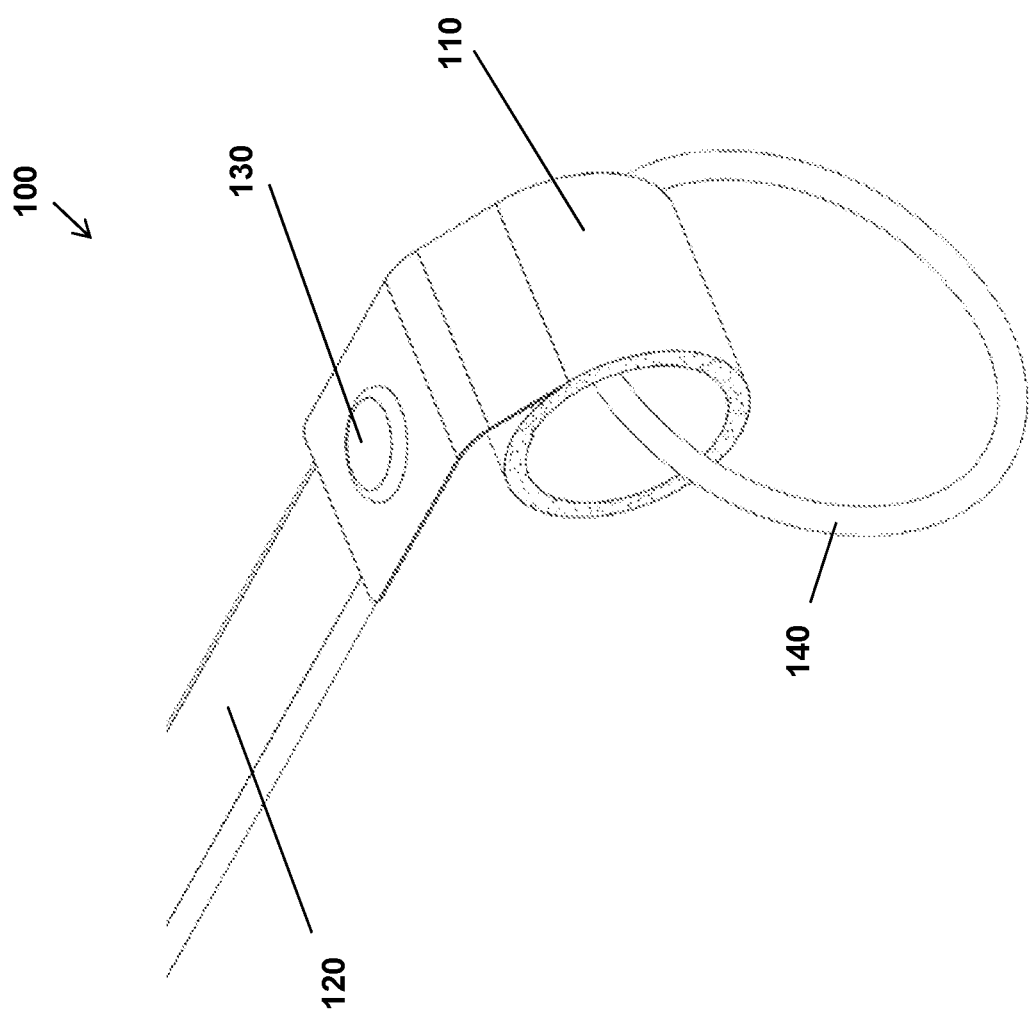
Figure 1C:
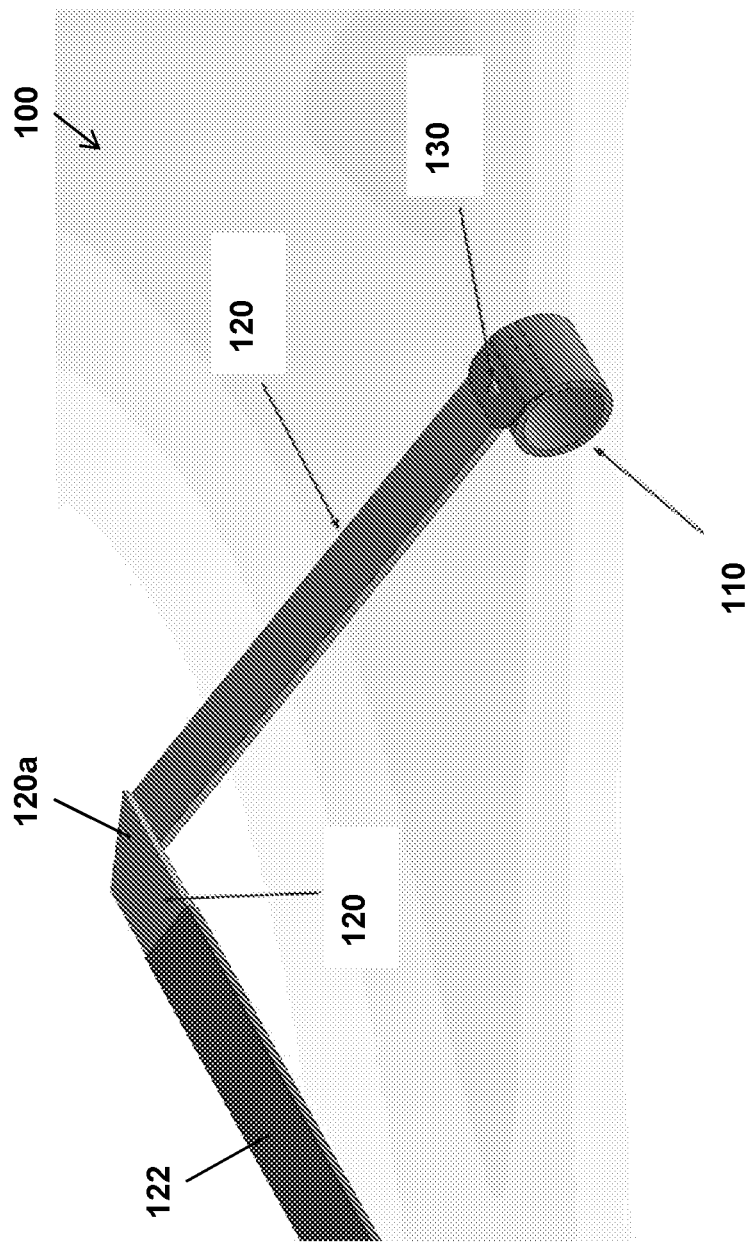

With reference to FIGS. 1A-1C, in a first exemplary embodiment, the invention provides a device 100 for the reconstruction or restoration of the metallic shield of a cable, wherein a clamping device 110 such as a constant force spring is attached directly to an integral conductive member 120 such as a tin plated copper braid with a securing feature 130 comprising one or more mechanical fasteners such as a rivet or other fastening feature to help align and start the spring. The conductive member 120 makes electrical contact to the cable neutrals. The conductive member 120 can be attached to the spring 110 at any angle. For example, the spring 110 can be provided with the integral conductive member 120 positioned perpendicular thereto as shown in FIG. 1A, or in line as shown in FIGS. 1B and 1C. In the latter case, as shown in FIG. 1C, the conductive member 120 can be folded at 120a to run perpendicular to the spring 110. The bend at 120a can be placed anywhere along the conductive member 120. As shown in FIG. 1C, the conductive member 120 may have a cover 122 (e.g., tape, coating, shrinkable seal, etc.) enclosing at least a portion of the distal end (away from the spring). An unwinding feature 140 such as a pull-loop can be provided (either passed through the axial opening of the constant force spring 110 as shown in FIGS. 1A and 1B or fastened thereto), but is not required (see FIG. 1C).

Figure 2:
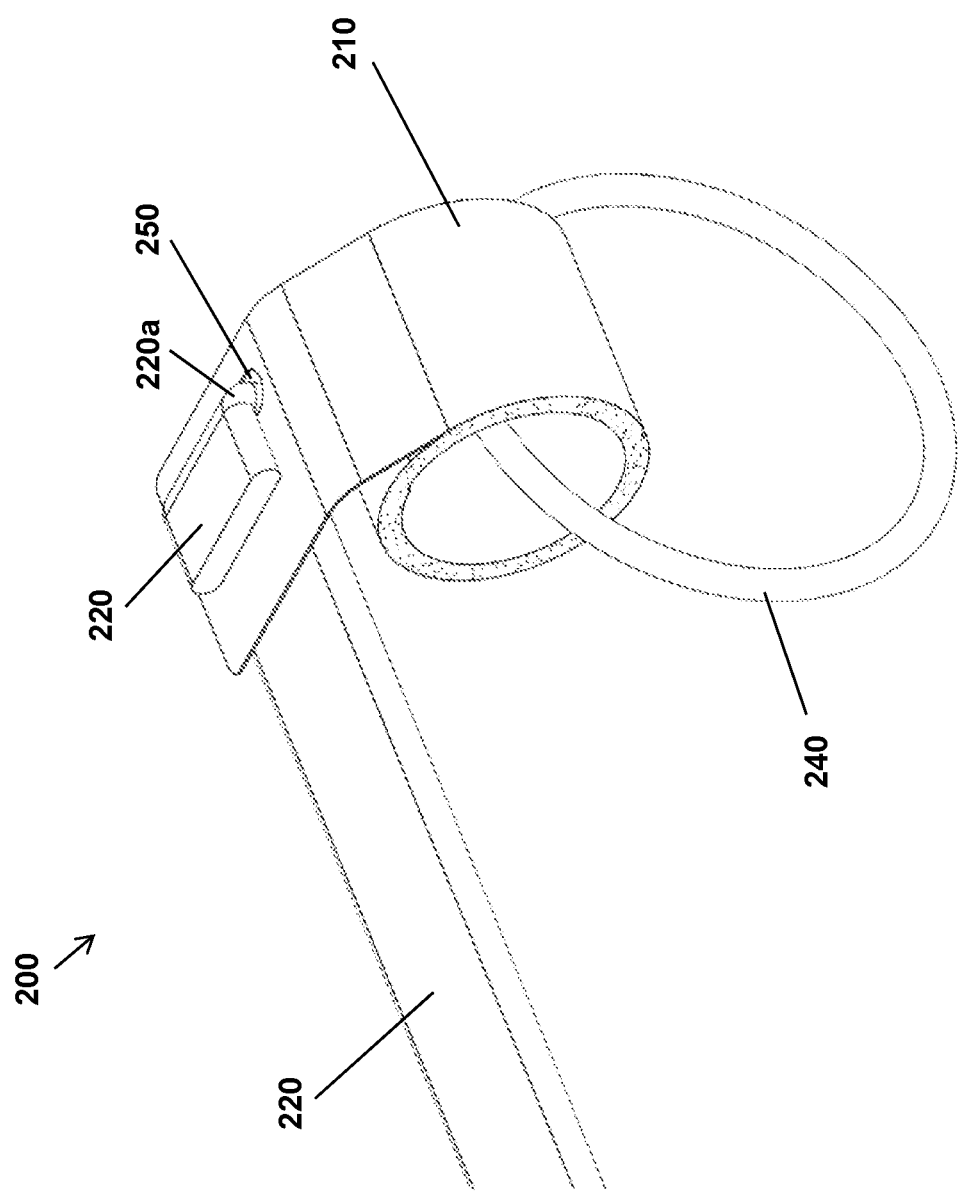
FIG. 2 shows a metallic shield connector of the present invention, according to a second exemplary embodiment.

With reference to FIG. 2, in a second exemplary embodiment, the invention provides a device 200 for the reconstruction or restoration of the metallic shield of a cable, wherein a clamping device 210 such as a constant force spring is attached directly to an integral conductive member 220 such as a tin plated copper braid without a rivet or other fastening feature. The constant force spring 210 can, for example, include a slit 250 through which conductive member 220 can be threaded and folded over at 220a to provide a securing feature. The integral conductive member 220 can be positioned perpendicular to the spring 210 as shown in FIG. 2, or in line with the spring (not shown). An unwinding feature 240 such as a pull-loop can be provided (either passed through the axial opening of the constant force spring 210 as shown in FIG. 2 or fastened thereto), but is not required.

Figure 3A:
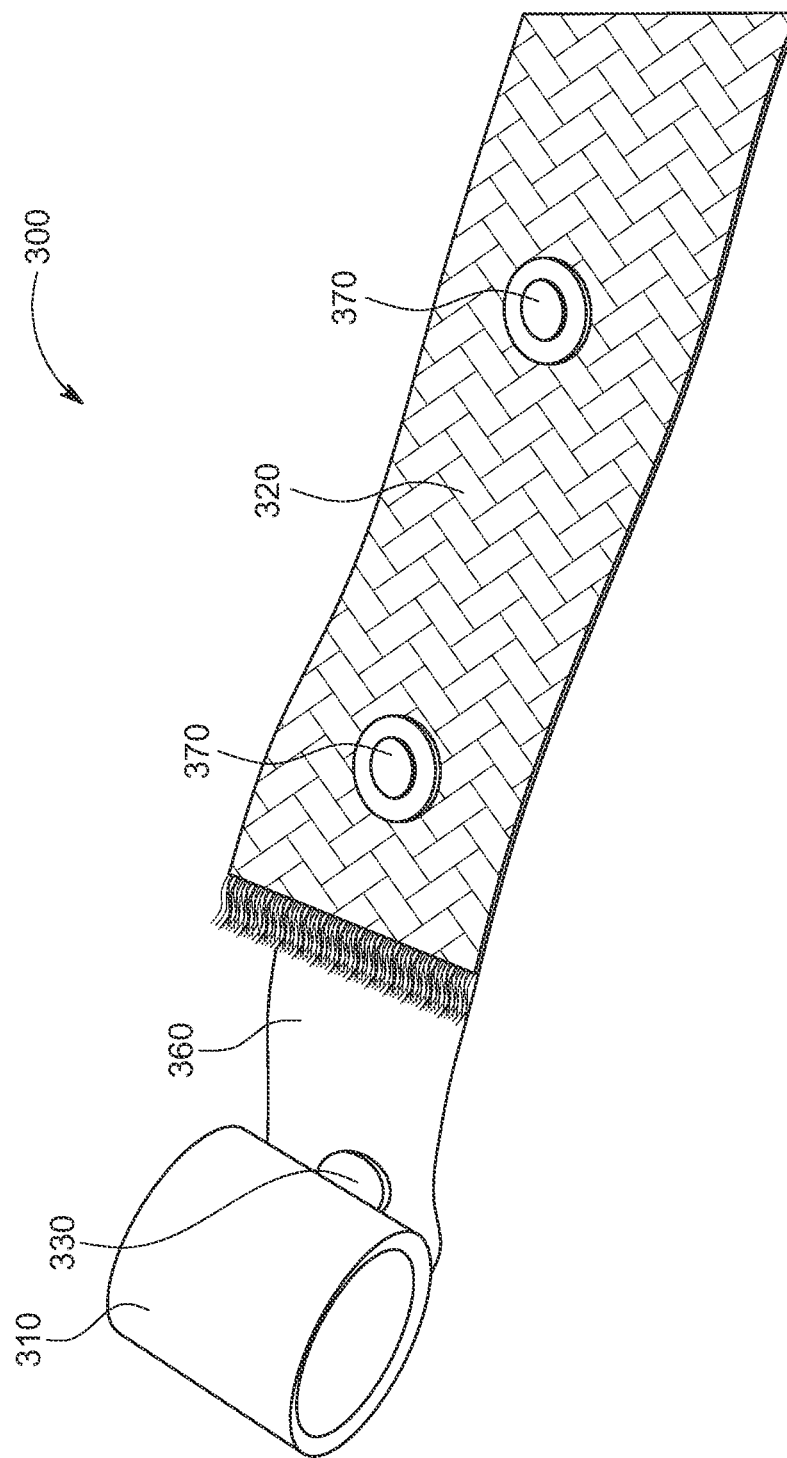
FIGS. 3A to 3E show a metallic shield connector of the present invention and method of installation thereof, according to a third exemplary embodiment.
Figure 3B:
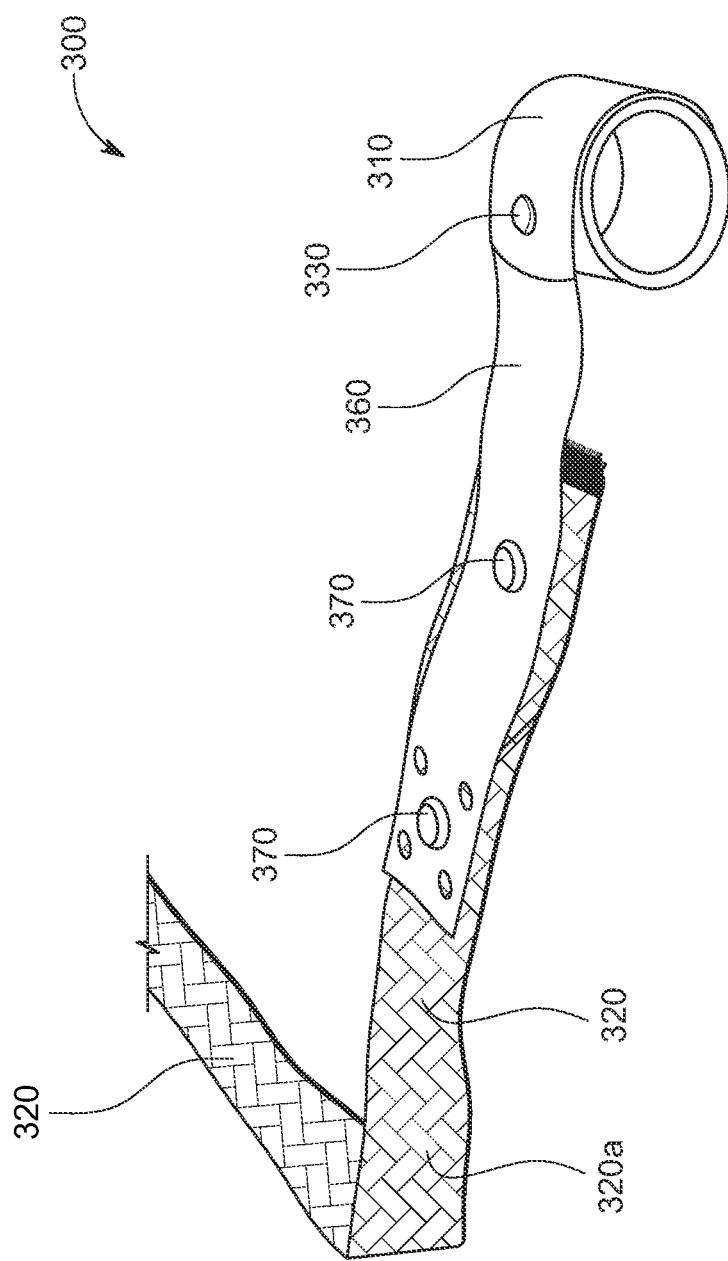

With reference to FIGS. 3A and 3B, in a third exemplary embodiment, the invention provides a device 300 for the reconstruction or restoration of the metallic shield of a cable, wherein a clamping device 310 such as a constant force spring is attached to an integral conductive member 320 such as a tin plated copper braid via a sheet 360 (e.g., copper). The braid 320 is mechanically and electrically connected to the sheet 360, and the sheet 360 is mechanically and electrically connected to the constant force spring 310. The sheet 360 is attached to the constant force spring 310 with a securing feature 330 comprising one or more mechanical fasteners such as a rivet or other fastening feature. The sheet 360 is attached to the conductive member 320 with one or more mechanical fasteners such as rivets 370 or other fastening feature. The sheet 360 can be positioned in line with the spring 310 as shown in FIGS. 3A and 3B, or at another angle (e.g., perpendicular). An unwinding feature such as a pull-loop (not shown) can be provided as illustrated for the first and second embodiments (either passed through the axial opening of the constant force spring or fastened thereto), but is not required.

Figure 3C:
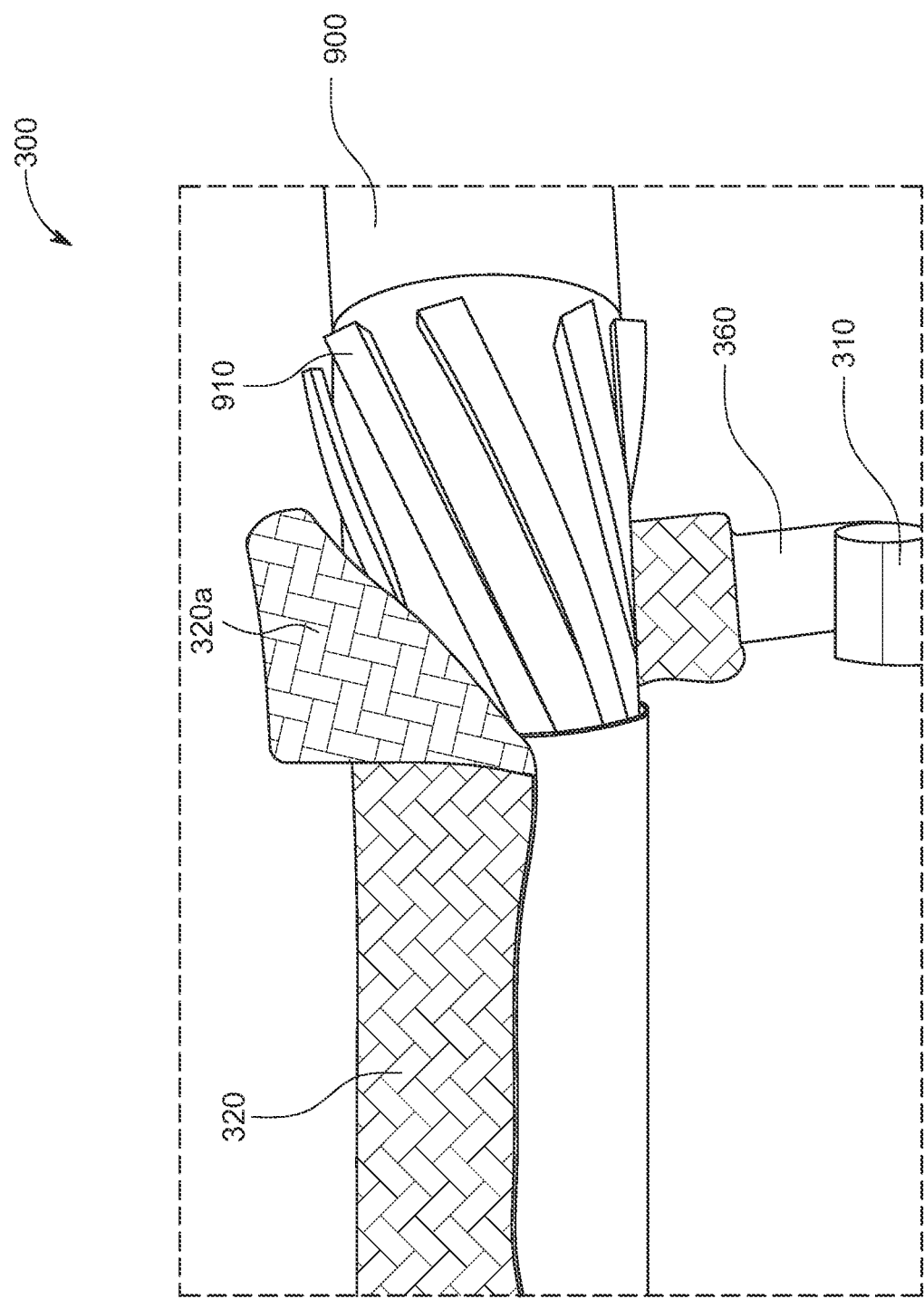
Figure 3D:
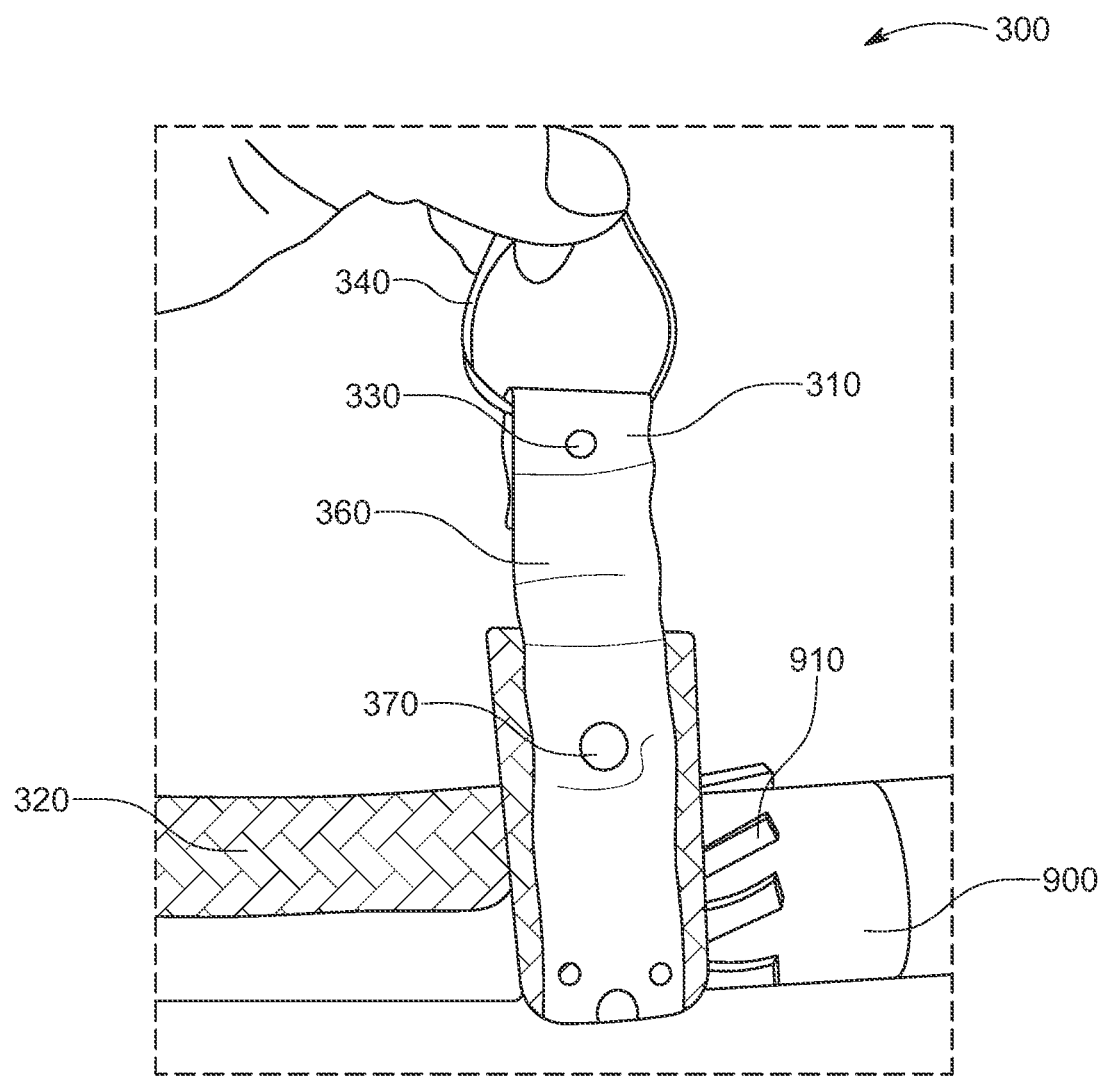
Figure 3E:
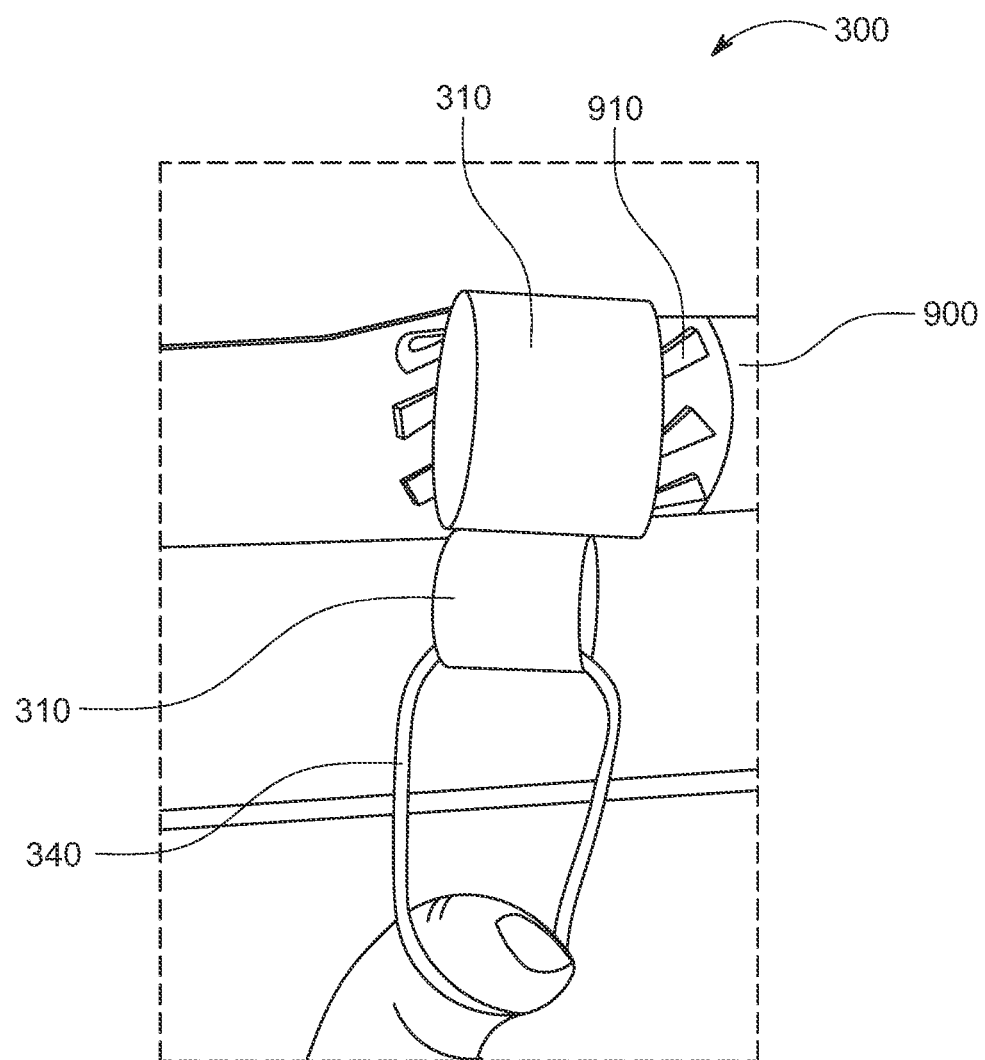

With reference to FIGS. 3C-3E, in an exemplary method of the present invention, the conductive member 320 with fold at 320a can be installed directly onto the cable neutrals 910 on cable 900 that are exposed in a splice region (see FIG. 3C) and wrapped around them (see FIG. 3D). The sheet 360 and constant force spring 310 can then be unrolled around the wrapped portion of conductive member 320 using a pull-loop 340 (either passed through the axial opening of the constant force spring 310 as shown in FIGS. 3D and 3E or fastened thereto) to facilitate the unrolling of the constant force spring 310. Tape may then be wrapped around at least a portion of the device 300 to further secure the device within the splice region.

Figure 4:
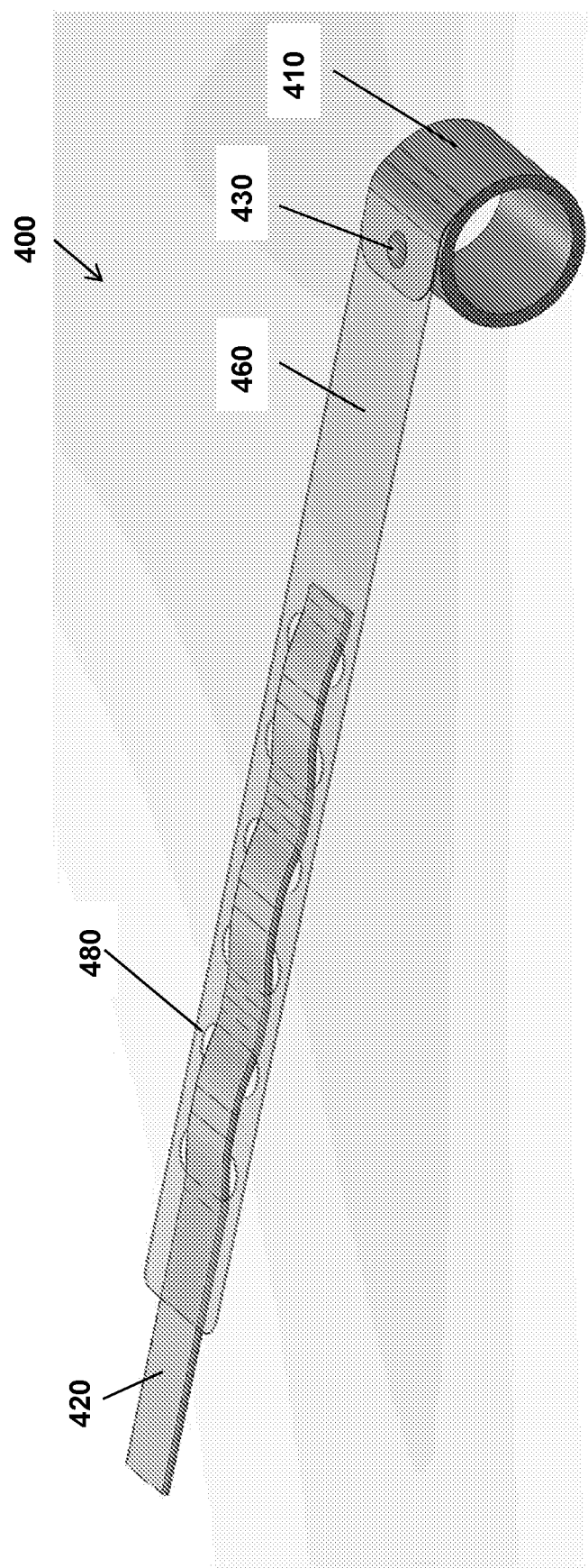
FIG. 4 shows a metallic shield connector of the present invention, according to a fourth exemplary embodiment.

With reference to FIG. 4, in a fourth exemplary embodiment, the invention provides a device 400 for the reconstruction or restoration of the metallic shield of a cable, wherein a clamping device 410 such as a constant force spring is attached to a conductive member 420 such as a tin plated copper braid via a sheet 460 (e.g., copper). The sheet 460 is attached to the constant force spring 410 with a securing feature 430 comprising one or more mechanical fasteners such as a rivet or other fastening feature. The sheet 460 includes one or more slits 480 through which the conductive member 420 is woven. In this embodiment, no separate mechanical fastener is provided to connect the sheet 460 and the conductive member 420; there is enough friction to provide a connection without needing a separate fastener. The sheet 460 can be positioned in line with the spring 410 as shown in FIG. 4, or at another angle (e.g., perpendicular). An unwinding feature such as a pull-loop (not shown) can be provided as illustrated for the first and second embodiments (either passed through the axial opening of the constant force spring or fastened thereto), but is not required.

Figure 5:
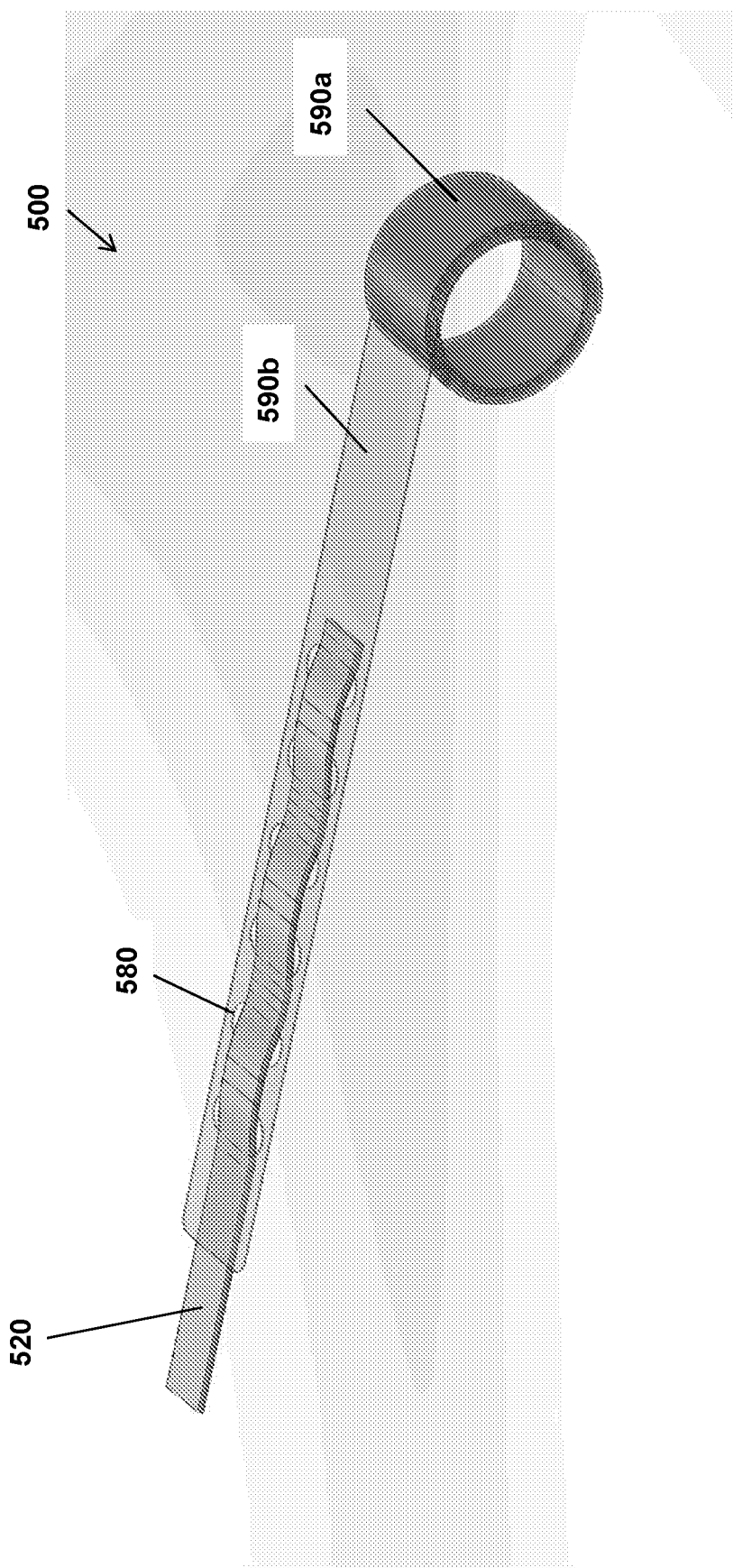
FIG. 5 shows a metallic shield connector of the present invention, according to a fifth exemplary embodiment.

With reference to FIG. 5, in a fifth exemplary embodiment, the invention provides a device 500 for the reconstruction or restoration of the metallic shield of a cable, wherein a clamping device 590a such as a constant force spring is attached to a conductive member 520 such as a tin plated copper braid via a sheet 590b. In this embodiment, the sheet 590b is merged with the constant force spring 590a—i.e., they are combined in one piece and comprise the same material (e.g., copper). The sheet 590b includes one or more slits 580 through which the conductive member 520 is woven. In this embodiment, no separate mechanical fastener is provided to connect the sheet 590b and the conductive member 520; there is enough friction to provide a connection without needing a separate fastener. The sheet 590b is in line with the spring 590a as shown in FIG. 5. An unwinding feature such as a pull-loop (not shown) can be provided as illustrated for the first and second embodiments (either passed through the axial opening of the constant force spring or fastened thereto), but is not required.

Figure 6A:
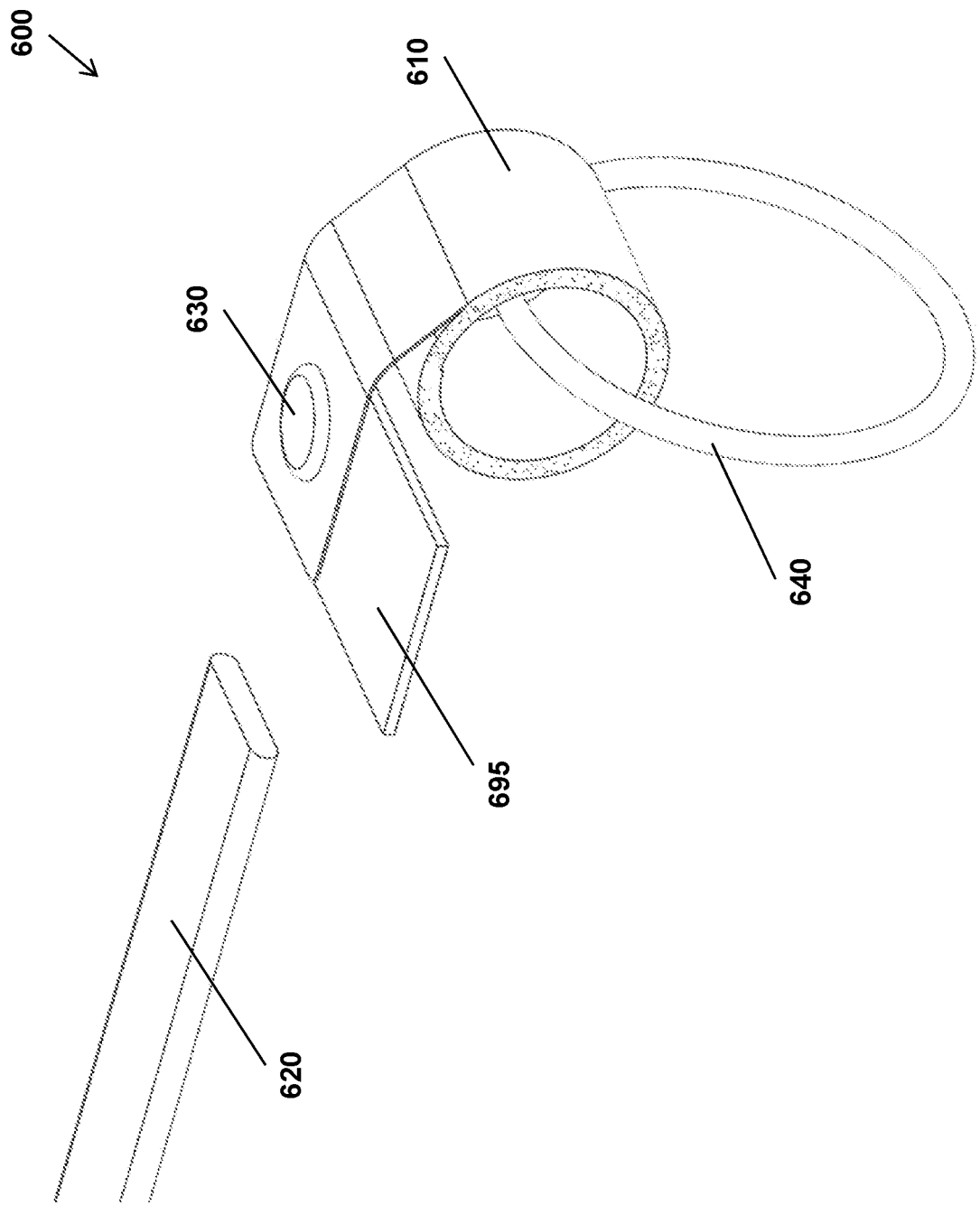
FIGS. 6A and 6B show a metallic shield connector of the present invention and method of installation thereof, according to a sixth exemplary embodiment.
Figure 6B:
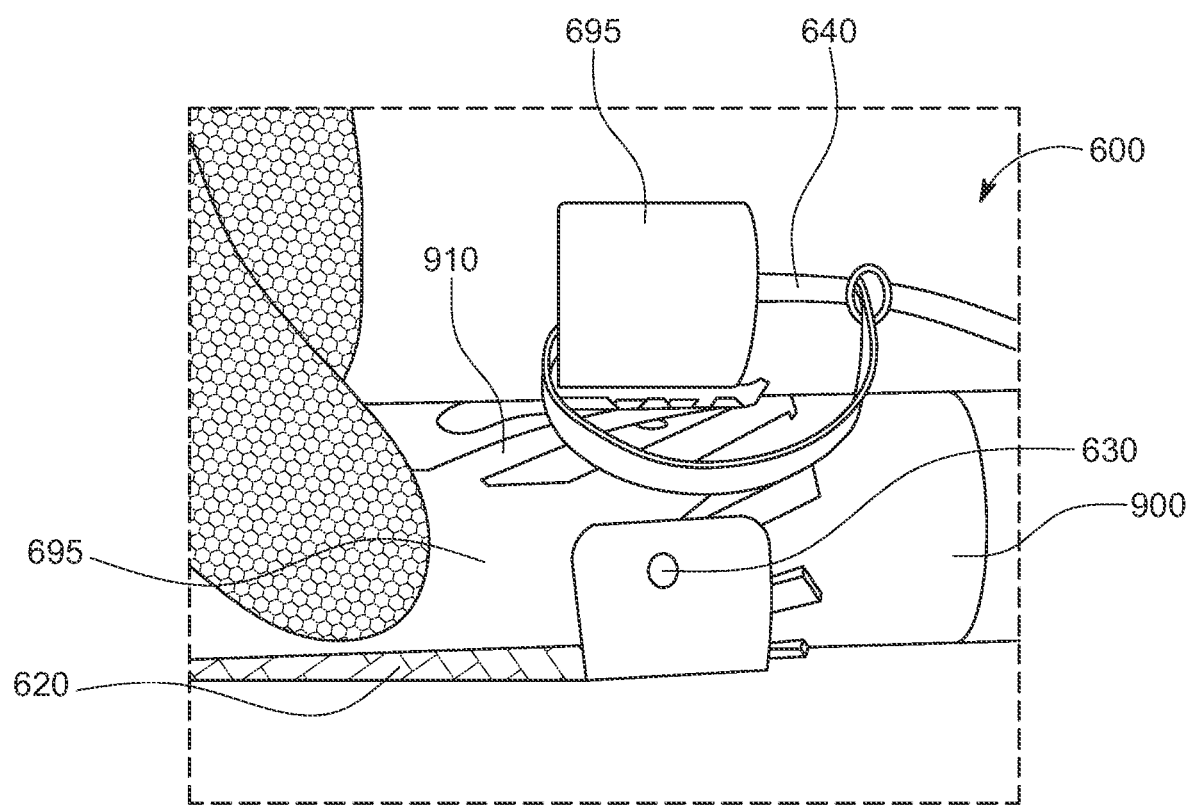

With reference to FIGS. 6A and 6B, in a sixth exemplary embodiment, the invention provides a device 600 for the reconstruction or restoration of the metallic shield of a cable, wherein a clamping device 610 such as a constant force spring and a conductive member 620 such as a tin plated copper braid are provided as separate components. A holding tab 695 is provided, comprising a separate piece of material (plastic or other non-conductive material) attached to the constant force spring 610 to help align and start the spring. In some embodiments, the holding tab 695 may be attached to the constant force spring 610 with a securing feature 630 comprising one or more mechanical fasteners such as a rivet or other fastening feature. In other embodiments, the holding tab may be integral to the spring (no rivet or other fastening feature). The holding tab 695 can be positioned perpendicular to the spring 610 as shown in FIGS. 6A and 6B, or at another angle. An unwinding feature 640 such as a pull-loop can be provided (either passed through the axial opening of the constant force spring 610 as shown in FIGS. 6A and 6B or fastened thereto), but is not required.

With reference to FIG. 6B, in an exemplary method of the present invention, the conductive member 620 can be installed directly onto the cable neutrals 910 on cable 900 and wrapped at least partially around them to provide electrical contact. The holding tab 695 can be used to hold the conductive member 620 and the constant force spring 610 in place on the cable neutrals 910 as the spring 610 is unrolled around the cable 900 with the aid of pull-loop 640.

Figure 7:
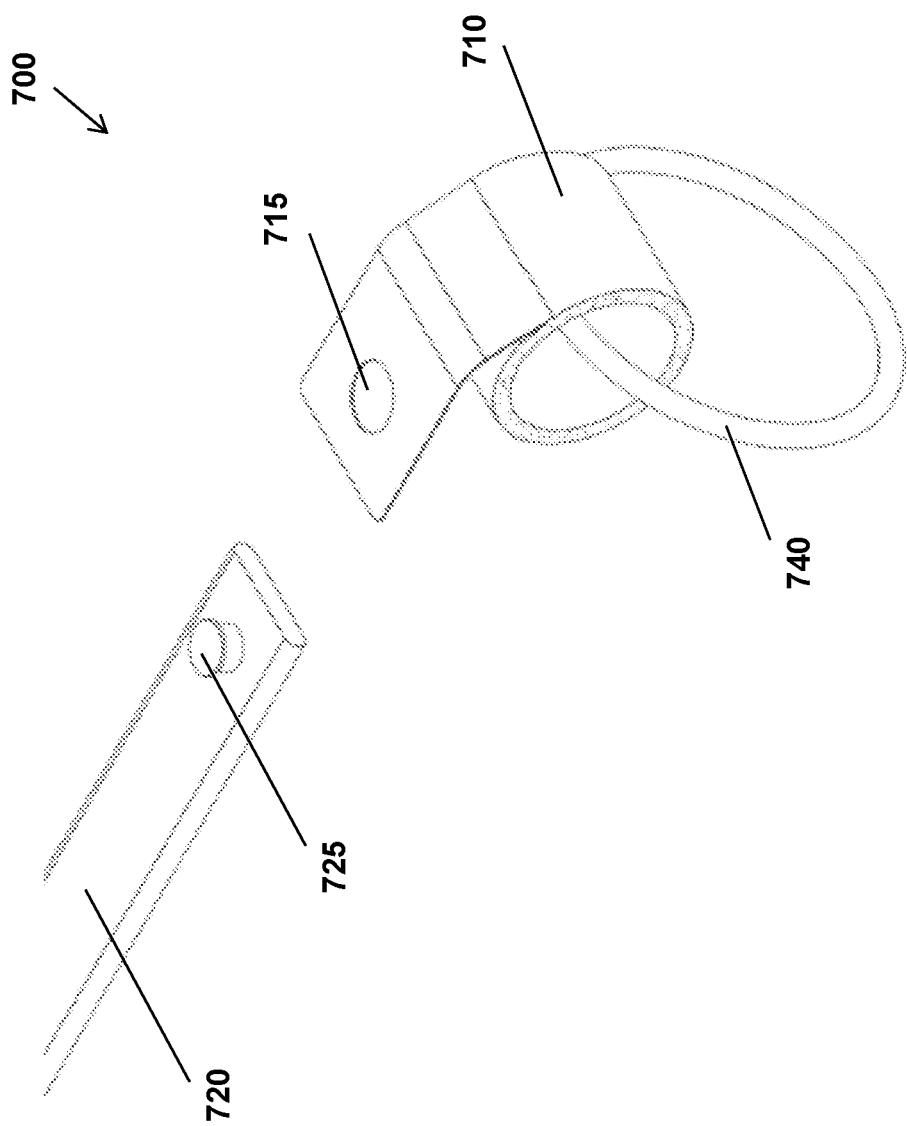
FIG. 7 shows a metallic shield connector of the present invention, according to a seventh exemplary embodiment.

With reference to FIG. 7, in a seventh exemplary embodiment, the invention provides a device 700 for the reconstruction or restoration of the metallic shield of a cable, wherein a clamping device 710 such as a constant force spring and a conductive member 720 such as a tin plated copper braid are provided as separate components. The constant force spring 710 includes a first element 715 configured to mate with a second element 725 on the conductive member 720 to help align and start the spring.

The first element 715 and the second element 725 together provide a securing feature. In some embodiments, as shown in FIG. 7, the first element 715 comprises a hole and the second element 725 comprises a corresponding pin or knob. In other embodiments, these elements may be reversed and/or may comprise other mating shapes or configurations. An unwinding feature 740 such as a pull-loop can be provided (either passed through the axial opening of the constant force spring 710 as shown in FIG. 7 or fastened thereto), but is not required.

In the sixth and seventh exemplary embodiments, the constant force spring end of the device is configured to be secured to the conductive member in the field at the time of installation on the cable metallic shield. In contrast, in the first through fifth embodiments, the constant force spring and the conductive member are assembled in the factory. See, for example, FIG. 1B (factory installed rivet) as compared to FIG. 7 (separate mating features).

While there have been shown and described fundamental novel features of the invention as applied to the preferred and exemplary embodiments thereof, it will be understood that omissions and substitutions and changes in the form and details of the disclosed invention may be made by those skilled in the art without departing from the spirit of the invention. Moreover, as is readily apparent, numerous modifications and changes may readily occur to those skilled in the art. Hence, it is not desired to limit the invention to the exact construction and operation shown and described and, accordingly, all suitable modification equivalents may be resorted to falling within the scope of the invention as claimed. It is the intention, therefore, to be limited only as indicated by the scope of the claims appended hereto.

What is claimed is:

1. A method for connecting to a metallic shield of a cable, the method comprising:
    wrapping an electrically conductive member comprising a metal braid at least partially around the metallic shield of the cable to establish electrical connection between the electrically conductive member and the metallic shield, the electrically conductive member being fixed to a spring member prior to the wrapping; and
    after the wrapping, applying force to the electrically conductive member with the spring member to hold the electrically conductive member against the metallic shield, wherein the applying includes:
        pulling on a loop of an unwinding feature of the spring member to unroll the spring member, and
        allowing the spring member to re-roll around the electrically conductive member to apply the force.

2. The method of claim 1, wherein the loop is a preformed metallic loop that is unrolled and then re-rolled to hold the electrically conductive member against the metallic shield of the cable.

3. The method of claim 1, wherein the spring member is configured to hold the electrically conductive member against the metallic shield of the cable with a constant pressure while allowing for expansion and contraction of the metallic shield.

4. The method of claim 3, wherein the spring member is a constant force spring.

5. The method of claim 1, wherein the electrically conductive member is fixed to the spring member via a conductive sheet.

6. The method of claim 5, wherein the conductive sheet is fixed to the spring member by a fastening feature.

7. The method of claim 5, wherein the conductive sheet includes at least one slit, and wherein the electrically conductive member is threaded through the at least one slit to secure thereto.

8. The method of claim 7, wherein the metal braid is threaded through one of the at least one slit.

9. A method for connecting to a cable, the method comprising:
    wrapping an electrically conductive member at least partially along a metallic shield of the cable to establish electrical connection between the electrically conductive member and the metallic shield, the electrically conductive member including at least one metal braid; and
    deploying a holding feature around the wrapped electrically conductive member to hold the electrically conductive member against the metallic shield of the cable, the holding feature including a spring and a conductive sheet fixed to the spring, the spring and the electrically conductive member being separate and distinct structures;
    wherein the conductive sheet includes at least one slit, and the electrically conductive member is extended through the at least one slit to secure thereto, such that the electrically conductive member is fixed to the spring via the conductive sheet.

10. The method of claim 9, wherein (i) the spring is provided with the electrically conductive member factory-installed thereon or (ii) the spring is field-installable on the electrically conductive member via a holding tab or mating features.

11. The method of claim 9, further comprising grasping and pulling an unwinding feature to unroll the spring and then wrapping the spring around the wrapped electrically conductive member.

12. The method of claim 11, wherein the unwinding feature includes a finger-sized loop attached to the spring.

13. The method of claim 9, wherein the at least one metal braid is extended through the at least one slit.

* * * * *